United States Patent [19]

Ogihara

[11] Patent Number: 5,386,386
[45] Date of Patent: Jan. 31, 1995

[54] REDUNDANCY CIRCUIT HAVING A SPARE MEMORY BLOCK REPLACING DEFECTIVE MEMORY CELLS IN DIFFERENT BLOCKS

[75] Inventor: Masaki Ogihara, Yokohama, Japan

[73] Assignee: Kabushiki Kaisha Toshiba, Kawasaki, Japan

[21] Appl. No.: 673,406

[22] Filed: Mar. 22, 1991

[30] Foreign Application Priority Data

Mar. 22, 1990 [JP] Japan .................................. 2-72818

[51] Int. Cl.$^6$ .................................................. G11C 7/00
[52] U.S. Cl. ..................................... 365/200; 365/96; 365/210
[58] Field of Search ........................... 365/200, 210, 96

[56] References Cited

U.S. PATENT DOCUMENTS

| | | | |
|---|---|---|---|
| 4,538,245 | 8/1985 | Smarandoiu et al. | 365/200 |
| 4,538,247 | 8/1985 | Venkateswaran | 365/200 X |
| 4,566,081 | 1/1986 | Ochii | 365/200 |
| 4,599,709 | 7/1986 | Clemons | 365/200 |
| 4,601,019 | 7/1986 | Shah et al. | 365/200 |
| 4,654,830 | 3/1987 | Chua et al. | 365/200 |
| 4,829,480 | 5/1989 | Seo | 365/200 |
| 5,051,954 | 9/1991 | Toda et al. | 365/149 X |
| 5,083,294 | 1/1992 | Okajima | 365/200 |
| 5,107,464 | 4/1992 | Sahara et al. | 365/200 |
| 5,146,429 | 9/1992 | Kawai et al. | 365/96 X |
| 5,157,628 | 10/1992 | Tani | 365/200 |
| 5,163,023 | 11/1992 | Ferris et al. | 365/200 |

Primary Examiner—Benny Lee
Attorney, Agent, or Firm—Oblon, Spivak, McClelland, Maier, Neustadt

[57] ABSTRACT

A semiconductor memory device having a redundancy circuit for remedying defective columns caused during manufacture, includes a plurality of spare memory cells for storing binary data, spare bit lines connected to the outputs of the spare memory cells, respectively, and each having two or more columns, a spare gate circuit for controlling the outputs of the spare bit lines, a circuit having storage sections for storing addresses of the defective columns, for generating a spare gate selection signal in response to one of the addresses of the defective columns and selecting a spare gate, and a circuit for prohibiting all the outputs from a column decoder in response to the spare gate selection signal. The defective columns are remedied in units of columns whose number is smaller than that of columns of the spare bit lines.

3 Claims, 3 Drawing Sheets

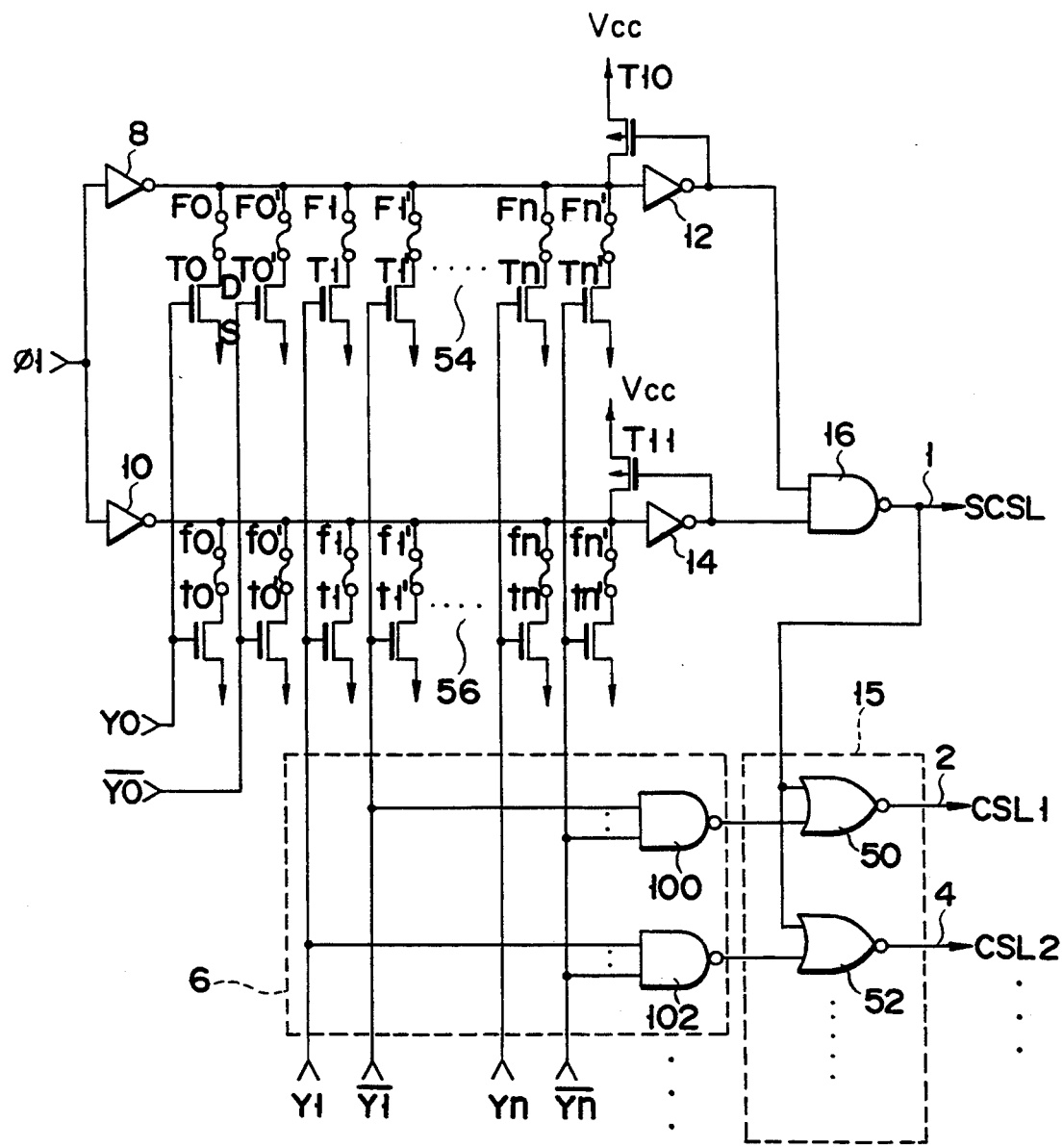
F I G. 2

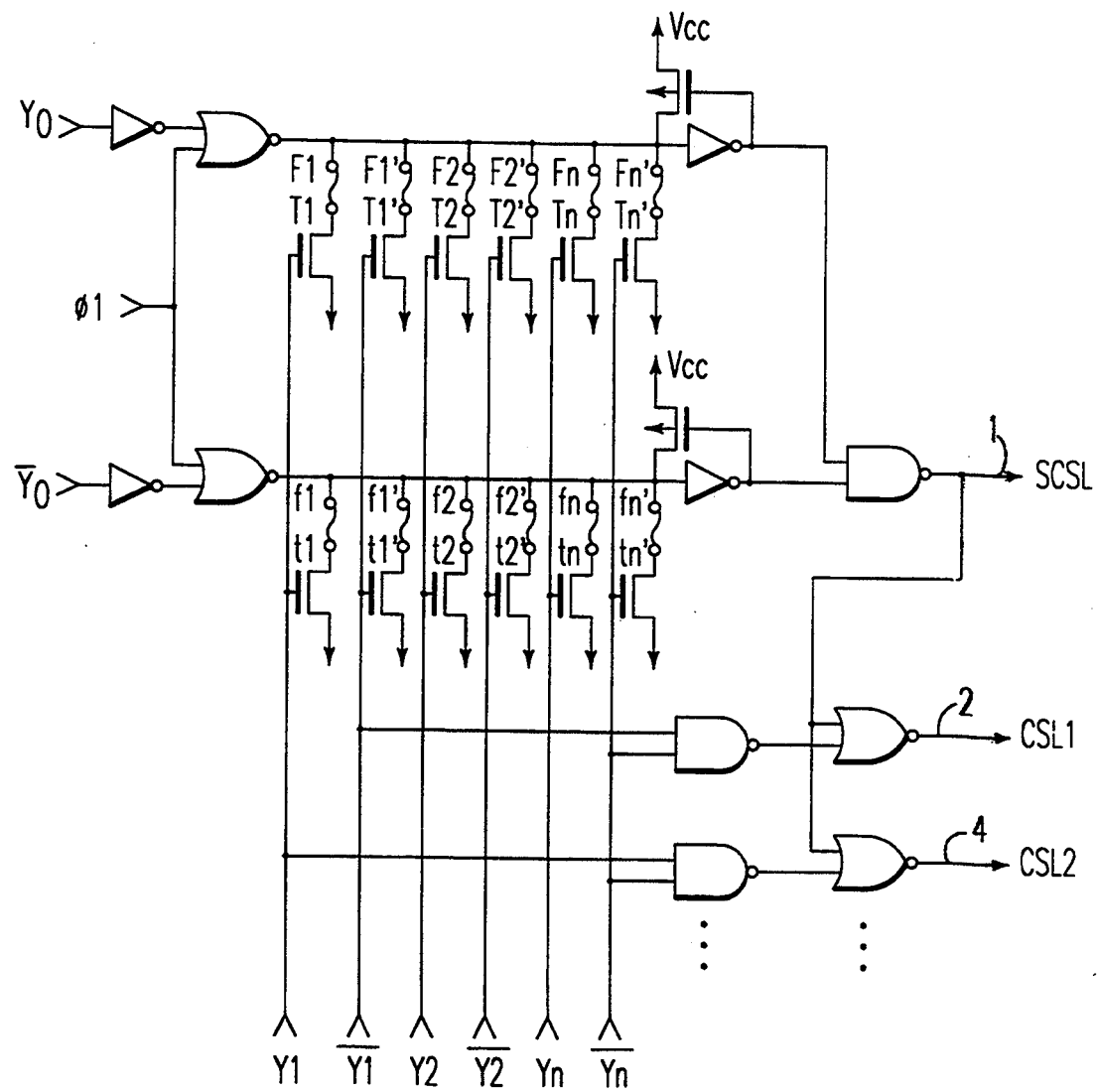
F I G. 3

REDUNDANCY CIRCUIT HAVING A SPARE MEMORY BLOCK REPLACING DEFECTIVE MEMORY CELLS IN DIFFERENT BLOCKS

BACKGROUND OF THE INVENTION

1. Field of the Invention

The present invention relates to a semiconductor memory device and, more particularly, to a redundancy circuit for remedying an error bit caused during the manufacture of the memory device.

2. Description of the Related Art

When a memory device has some defective memory cells, even if only one, it cannot be delivered as a product. However, due to the existence of debris or the like during the memory chip manufacturing process, it is very difficult to manufacture a chip so that all of its bits operate correctly. As memory micropatterning is advanced, a chip is more and more likely to be adversely affected by such debris and the like.

For this reason, a semiconductor memory employs a redundancy circuit that replaces a defective memory cell with a spare cell to remedy errors ranging from several bits to several kilo bits, thereby maintaining the entire chip as a non-defective article. The redundancy circuit replaces a bit or word line connected to a defective memory cell with a spare bit or word line connected to a spare memory cell provided in the same chip. For example, when bit lines are to be replaced, a spare column decoder having a plurality of fuses for decoding the column addresses of the bit lines is used. The fuses corresponding to the column addresses of the defective memory cell are disconnected. Then, when the addresses of the defective bit lines are input to the decoder, a selection signal is output to spare column selecting lines, thereby selecting spare bit lines. Simultaneously, a signal for selecting bit lines to which the defective memory cell is connected is disabled. As a result, the bit lines are replaced with the spare bit lines. The redundancy circuit for replacing the word lines also uses a spare row decoder having a plurality of fuses for decoding row addresses of the word lines.

In conventional memory devices, columns of memory cells, which are selected by column selection lines, are arranged in units of two (connected to four bit lines) or four (connected to 8 bit lines), for two reasons. First, the column selection lines need to be arranged at short intervals since the memory device has many small memory cells, thus having a large storage capacity. Second, it is necessary to reduce the bits of a column address by one bit, thereby to decrease the area occupied by the column decoder.

In a conventional redundancy circuit, the number of memory-cell columns, which are selected by one spare column selection line, is equal to the number of the columns which are selected by one column selection line. Hence, a spare column selection line can be substituted only for a column selection line which has a predetermined number of bit lines. Most conventional devices have only one spare column line. If they have two or more spare column lines, they would have more spare memory cells, and would inevitably have a larger chip size.

The probability D that short-circuiting between any adjacent two bit lines in the conventional circuit described above cannot be remedied, is given by the following equation.

$$\beta = \frac{(Nbl/Nsbl) - 1}{Nbl - 1}$$

where Nsbl: the number of spare bit lines

Nbl: the total number of bit lines excluding spare bit lines

For example, when the number of spare bit lines Nsbl is 4 and the total number of lines excluding spare bit lines Nbl is 8, $\beta = 1/7$. Namely, when each memory chip has one short-circuited portion, one out of every seven memory chips is estimated to be incapable of being remedied. In order to remedy such inter-bit line short-circuiting, a large number of spare column decoders must be provided, resulting in the increase in spare memory cells and considerable increase in chip area. Manufacturing cost also augments.

SUMMARY OF THE INVENTION

It is an object of the present invention to provide a redundancy circuit capable of remedying a defect due to short-circuiting of any adjacent bit lines by using the same number of spare bit lines as in a conventional redundancy circuit.

According to the present invention, there is provided a redundancy circuit of a semiconductor memory device having a plurality of memory cells for storing binary data, a plurality of bit lines respectively connected to the plurality of memory cells, a plurality of column gating circuits each for selecting one of units of predetermined number of the plurality of bit lines, and a column decoder for receiving addresses for the units of predetermined number of bit lines and for outputting a selection signal to the plurality of column gating circuits, comprising: a plurality of spare cells for remedying a defective one of the plurality of memory cells; a plurality of spare bit lines, respectively connected to the plurality of spare cells, for remedying a defective bit line among the plurality of bit lines and the defective memory cell, that is defective portions, a spare column gating circuit for selecting a set of a predetermined number of the spare bit lines; a spare column decoder, which receives a column address signal for the bit lines, in which column addresses of the defective portions are programmed, and which outputs a signal to the spare column gating circuit upon reception of one of the column addresses of the defective portions; a predetermined number of data transmission common buses each for connecting one of the set of spare bit lines with one bit line in units of bit lines, the spare bit lines to be connected by the common buses being different from the bit lines; a common bus selecting circuit for receiving a predetermined lower bit of the column address and selecting a predetermined one of the common buses; and a defective column selection prohibiting circuit for prohibiting output from the column decoder by using an output from the spare column decoder when the column addresses of the defective portions are input to the spare column decoder.

When the redundancy circuit of the present invention is used, short-circuiting at any adjacent bit or word lines can be remedied without increasing the number of the spare memory cells. Furthermore, even when a plurality of defective rows or columns exist at different places spaced from each other by a width more than that occupied by spare row or column lines, they can be replaced with spare columns (or rows), even if the address bits input to the common bus selecting circuit are different for the different defective columns (or rows).

Additional objects and advantages of the invention will be set forth in the description which follows, and in part will be obvious from the description, or may be learned by practice of the invention. The objects and advantages of the invention may be realized and obtained by means of the combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a block diagram of a spare column decoder according to the first embodiment of the present invention; and FIG. 3 is a block diagram of a spare column decoder according to the second embodiment of the present invention.

DETAILED DESCRIPTION OF THE PREFERRED EMBODIMENTS

Figure 1:
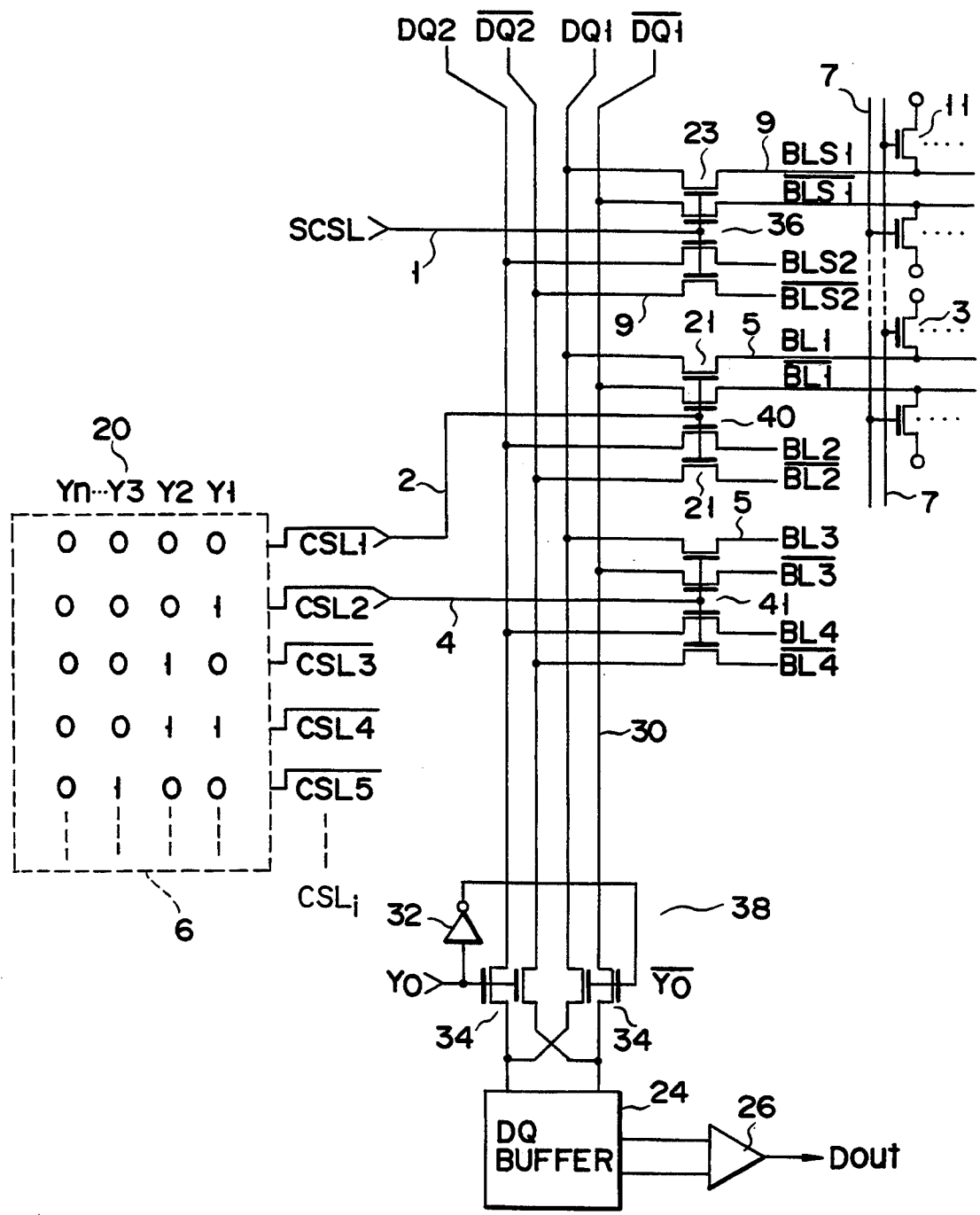
FIG. 1 shows transmission buses of data output from bit lines selected by a column selecting signal and a spare column selecting signal.

A redundancy circuit of the present invention will be described by way of preferred embodiments thereof with reference to the accompanying drawings.

FIG. 1 is a circuit diagram of a conventional circuit and shows a set (e.g., 4 bit lines, i.e., 2-bit binary data) of a predetermined number of spare bit lines selected by a spare column selecting signal (SCSL) supplied from a spare column decoder as schematically shown in FIG. 2, and 2 units (e.g., 8 lines, i.e., 4-bit binary data) of a predetermined number of bit lines 5 selected by a column selecting signal CSLi (i=1, 2, . . . ) supplied from a column decoder 6.

Referring to FIG. 1, the bit lines 5 (BL1, $\overline{BL1}$, BL3, $\overline{BL3}$, BL4, $\overline{BL4}$ are connected to a plurality of memory cells 3, and the gates of the memory cells 3 are connected to word lines 7. Note that a spare memory cell and a spare bit line selected by the spare column selecting signal SCSL are referred to as a spare cell 11 and the spare bit line 9, respectively. The column decoder 6 receives a column address (Y1, Y2, Y3, . . . , Yn) 20 for accessing each unit of the bit lines 5. The column address (Y1, Y2, Y3, . . . , Yn) 20 is decoded by the column decoder 6, and one of the column selecting signals CSLi is used as an output signal of the decoder 6. In FIG. 1, the column decoder 6 is illustrated by way of its function. Characters "0" and "1" in the decoder 6 designate the logic levels of an input address signal (Y1, Y2, Y3, . . . , Yn). A column selecting line (2, 4, . . . ) and four FET transistors 21 connected to each column selecting line constitute each column gating circuit (40, 41, . . . ).

For example, when the address signal (Y1, Y2, Y3, . . . , Yn)=(0, 0, . . . , 0), the signal CSL1 becomes high level. As a result, the column selecting signal CSL1 activates the column gating circuit 40. When the gates of the four FET transistors 21 become high level, the logic data on the four bit lines (BL1, $\overline{BL1}$, BL2, $\overline{BL2}$) is supplied onto data transmission common buses 30. Each data transmission bus 30 connects one spare bit line 9 of a set and one of bit lines 5 in each bit line unit and is controlled by one of inputs DQ1, $\overline{DQ1}$, DQ2, $\overline{DQ2}$. The respective data transmission common buses connect different spare bit lines and bit line 5. Therefore, the number of data transmission buses 30 is the same as the number of spare bit lines in one set or the number of bit lines in one unit. Two-column (four bit lines) binary data supplied to the common buses 30 are gated by four FET transistors 34. An inverter 32, two transistors 34 with gates connected to the input of the inverter 32, and two transistors 34 with gates connected to the output of the inverter 32 constitute a common bus selecting circuit 38. A least significant bit Y0 of the column address is input to the common bus selecting circuit 38, and the two-column data on the four common buses 30 is selected by the two bit lines. The signal on the selected two bit lines is amplified by a DQ buffer 24 and is digitized by a differential amplifier 26 and output as Dout.

When a column address indicating a defective portion is input to the column address decoder 6, generation of the column selecting signal CSLi is prohibited, and a spare column selecting line 1 becomes high level. The spare column selecting line 1 and four FET transistors 23 connected thereto form a spare column gating circuit 36. When the signal SCSL becomes high level, the spare column gating circuit 36 is activated. As a result, the signals on the four bit lines (BLS1, $\overline{BLS1}$, BLS2, $\overline{BLS2}$) are supplied onto the data transmission common buses 30.

FIG. 2 shows a spare column decoder circuit according to the embodiment of the present invention. The number of fuses (F0, F0', F1, Fi', . . . , Fn, Fn') of a first fuse group is the same as the number of bits of positive and negative logic column addresses (Y0, $\overline{Y0}$ Y1, $\overline{Y1}$ . . . , Yn, $\overline{Yn}$). One end of each of the fuses is connected to a corresponding one of the drains 10 of MOS-FETs (T0, T0', T1, TI', . . . , Tn, Tn'), and the other end thereof is commonly connected to the input of an inverter 12 and the output of an inverter 8. When the fuses of the fuse group are selectively disconnected, the address of the first defective portion is programmed. The sources of the MOS-FETs (T0, T0', T1, TI', . . . , Tn, Tn') are grounded. The output of the inverter 12 is connected to the gate of the MOS-FET T10, and the source and drain of the MOS-FET T10 are connected to a power source and the input of the inverter 12, respectively. The gates of the MOS-FETs (T0, T0', T1, Ti', . . . , Tn, Tn') receive the positive or negative logic address signal (Y0, $\overline{Y0}$, Y1, $\overline{Y1}$, . . . , Yn, $\overline{Yn}$). The output of the inverter 12 is also connected to one input of a NAND gate 16. In this manner, the first fuse group (F0, F0, F1, F1', . . . , Fn, Fn') and the MOS-FETs (T0, T0', T1, Ti', . . . , Tn, Tn') connected thereto form one defective column decoder 54.

The input of the inverter 8 and that of an inverter 10 are commonly connected to receive a signal φ1. The signal 100 1 is low level ("0") during a normal operation and is high level ("1") during the operation test of a memory cell other than the spare cell.

The number of fuses (f0, f0', f1, f1', . . . , fn, fn') of a second fuse group is the same as the number of bits of positive and negative logic column addresses (Y0, $\overline{Y0}$, Y1, $\overline{Y1}$, . . . , Yn, $\overline{Yn}$). One end of each of the fuses is connected to a corresponding one of the drains of MOS-FETs (t0, t0', t1, t1', . . . , tn, tn'), and the other end thereof is commonly connected to the output of the inverter 10 and the input of an inverter 14. When the fuses of the fuse group are selectively disconnected, the address of the second defective portion is programmed. The sources of the MOS-FETs (t0, t0', t1, t1', ..., tn, tn',) are grounded. The fuses (f0, f0', f1, f1', ..., fn, fn') of the second fuse group and the MOS-FETs (t0, t0', t1, t1', ..., tn, tn') connected thereto form another defective column decoder 56. The output of the inverter 14 is connected to the gate of a MOS-FET T11, and the source and drain of the MOS-FET T11 are connected to the power source and the input of the inverter 14, respectively. The gates of the MOS-FETs (t0, t0', t1, t1', ..., tn, tn') receive the positive or negative logic address signal (Y0, $\overline{Y0}$, Y1, $\overline{Y1}$, ..., Yn, $\overline{Yn}$). The output of the inverter 14 is also connected to the other input of the NAND gate 16. As a result, the NAND gate 16 outputs the spare column selecting signal SCSL to select the spare column selecting line 1.

The inputs of NAND gates (100, 102, ...) are selectively connected to the column address inputs (Y1, $\overline{Y1}$, ..., Yn, $\overline{Yn}$), and decoded column address selecting signals appear at the outputs thereof. Hence, the circuit surrounded by the dashed line is a column address decoder 6.

The output of the NAND gate 16 is connected to one input of each of NOR gates (50, 52, ...), and the output of each of the NAND gates (100, 102, ...) is connected to the other input of a corresponding one of the NOR gates (50, 52, ...). The NOR gates (50, 52,) respectively output the column selecting signals (CSL1, CSL2, ...). The portion surrounded by dashed lines is a defective portion column selection prohibiting circuit. Column selecting lines 2, 4 are used to output column selecting signals CSL1, CSL2, respectively from NOR gates 50, 52.

The operation of the present invention will be described.

Assume that short-circuiting occurs between the bit lines BL2 and BL3 shown in FIG. 1. In this case, among the fuses of the first fuse group shown in FIG. 2, the fuses F0, F1' ..., and Fn' corresponding to the column address (Y0, Y1, ..., Yn)=(1, 0, ..., 0) of the column to which the bit line BL2 belongs are to be disconnected electrically or by using a laser. Then, among the fuses of the second fuse group, the fuses f0', f1, ..., and fn' corresponding to the column address (Y0, Y1, ..., Yn)=(0, 1, ..., 0) of the column to which the bit line BL3 belongs are to be disconnected.

As a result, during the normal operation, when a column address signal (Y0, Y1, ..., Yn)=(1, 0, ..., 0) for selecting the defective bit line $\overline{BL2}$ is generated, the gate of the transistor T0 to which the signal Y0 is supplied becomes high level to turn on the transistor T0. In this case, since the fuse F0 of the first fuse group is disconnected, the address signal Y0 is not supplied to the input circuit of the inverter 12. Similarly, another address signal (Y1, Y2, ..., Yn)=(0, ..., 0) is not supplied to the input circuit of the inverter 12 either. Since the signal $\phi 1$ is at low level, the output SCSL from the NAND gate 16 becomes high level. Thus, the spare column selecting signal SCSL of FIG. 1 becomes high level to select the spare column. Since the input of the NOR gate 50 to which the signal SCSL is supplied is high level, the output CSL1 of the NOR gate 50 becomes low level. As a result, the column selecting line CSL1 shown in FIG. 1 becomes low level, and the bit line $\overline{BL2}$ is not selected.

Similarly, when an address signal (Y0, Y1, ..., Yn)=(0, 1, ..., 0) for selecting the column selecting line 4 of the defective bit line BL3 is generated, the gate of the transistor t1 to which the signal Y1 is supplied becomes high level to turn on the transistor t1. In this case, since the fuse f1 of the second fuse group is disconnected, the address-signal Y1 is not supplied to the input circuit of the inverter 14. Similarly, another address signal (Y0, Y2, ..., Yn)=(0, 0 ..., 0) is not supplied to the input circuit of the inverter 14 either. As a result, the output SCSL from the NAND gate 16 becomes high level. Thus, the spare column selecting signal SCSL of FIG. 1 becomes high level to select the spare column. Since the input of the NOR gate 52 to which the signal SCSL is supplied is high level, the output CSL2 of the NOR gate 52 becomes low level. As a result, the column selecting line 4 shown in FIG. 1 becomes low level, and the bit line BL3 is not selected. In this manner, BL2, $\overline{BL2}$, BL3, and $\overline{BL3}$ are replaced with BLS2, BLS2, BLS1, and BLS1.

In the spare column decoder described above, the fuses F0 and F0' must be disconnected with a different pattern from that with which the fuses f0 and f0' are disconnected. This is because when these two fuse pairs are disconnected with the same pattern, the same spare cell is selected.

Furthermore, this circuit can remedy, depending on the case, independent defects occurring on bit lines which are not adjacent to each other. Assume that defective portions exist on the lines BL1 and BL4. A line BL1 can be selected by a column address (Y0, Y1, ..., Yn)=(0, 0, ..., 0) Accordingly, the fuses F0', F1', ..., and Fn' of the first fuse group that correspond to this address are disconnected. Then, the line BL4 can be selected by a column address (Y0, Y1, ..., Yn)=(1, 1, ..., 0). Accordingly, the fuses f0, f1, ..., and fn' of the second fuse group that correspond to this address are disconnected. As a result, when these addresses are selected during the normal operation, the spare column selecting signal SCSL becomes high level, and the column selecting signals CSL1 and CSL2 become low level. As a result, in FIG. 1, the spare column is selected, and the lines BLS2 or BLS1 are selected by a bit signal Y0=1 or 0 which is the LSB of the addresses. In other words, if the two independent defective columns belong to Y0 and $\overline{Y0}$, respectively, they can be remedied.

FIG. 3 shows a spare column decoder according to another embodiment of the present invention. In this embodiment, the fuse groups of the spare column decoder receive only an address (Y1, $\overline{Y1}$, ..., Yn, $\overline{Yn}$). Two fuse groups are provided, as in FIG. 2, to be controlled by Y0 and $\overline{Y0}$, respectively. As shown, MOS-FET transistors T1, T1'... Tn, Tn' are connected at their drain regions to a corresponding one of fuses F1, F1'... Fn, Fn'. Also, MOSFET transistors t1, t1'... tn, tn' are connected at their drain regions to a corresponding one of fuses f1, f1'... fn, fn'. In the same manner as in the above embodiment, assume that lines $\overline{BL2}$ and BL3 form a defective column. The column selecting line 2 for selecting the line $\overline{BL2}$ has an address (Y1, Y2, ..., Yn)=(0, 0, ..., 0). Accordingly, the fuses F1', F2', ..., and FN, Fn' of the first fuse group that correspond to this address are disconnected. The line BL3 is selected by a column address (Y1, Y2, ..., Yn)=(1, 0, ..., 0). Accordingly, the fuses f1', f2', ..., and fn' of the second fuse group that correspond to this address are disconnected. When these addresses are selected during the normal operation, the spare column selecting signal SCSL output on spare column selecting line 1 becomes high level and the column selecting signal CSL1 and CSL2 become low level. As a result, the spare column in FIG. 1 is selected, and the line BLS2 or BLS1 is selected by Y0=1 or 0 which are the LSBs of the addresses.

When the column selected by the column selecting signal CSL1 is to be entirely replaced, the fuses of the first and second fuse groups that are associated with the bits Y1, ..., and Yn are disconnected with the same pattern. When defective portions exist on the bit lines BL1 and BL4, the fuses (f1', f2', ..., fn') of the fuse group to which a bit $\overline{Y0}$ is supplied are disconnected, and the fuses (F1, F2', ..., Fn') of the fuse group to which a bit Y0 is supplied are disconnected, thereby remedying the bit lines BL1 and BL4. Control signal $\phi$ is used to supply a "1" or "0" level signal to the other input of the NOR gates supplied with inputs of logic column address signals Y0, $\overline{Y0}$.

In these embodiments, the number of bit lines selected by a single spare column selecting line SCSL is four. However, as described above, a defective portion can be remedied in units of two bit lines. When the number of bit lines selected by a single spare column selecting line SCSL is eight, a defective portion can be apparently remedied in units of two or four bit lines. Thus, in the redundancy circuit of the present invention, assuming that the number of spare bit lines is m, a bit line on which a defective portion exists can be remedied in units of:

$$m/2^n \ (n=0, 1, 2, \ldots, 2^n < m)$$

The two embodiments described above are merely circuit examples, and various changes and modifications can be made within the spirit and scope of the invention. The characteristic feature of this circuit lies in that the plurality of spare column addresses are used to select a spare column. By using the plurality of spare column addresses, a spare column can remedy defective portions at a smaller pitch than in a conventional case.

In the embodiments, a defective column remedy circuit is referred to. It is apparent that the present invention can be applied to a defective row remedy circuit. Furthermore, the present invention can be suitably applied to any types of memories such as an SRAM (Static Random Access Memory), a DRAM (Dynamic Random Access Memory), and a ROM (Read-Only Memory).

What is claimed is:

1. A semiconductor memory device having a redundancy circuit for remedying defective columns having defective column addresses, said semiconductor memory device comprising:

a plurality of blocks of memory cells, each of said blocks comprising a plurality of memory cells arranged in a matrix pattern having rows and columns, for storing binary data, each of said memory cells having an output;

a plurality of bit lines respectively connected to the outputs of the memory cells, said bit lines being grouped into bit line pairs, each of said bit line pairs corresponding to one column, being used for transferring one binary data, and having a first address;

a plurality of gate means, each for gating signals which are transmitted on bit lines of bit line pairs corresponding to at least two columns, each of said gate means having inputs to which the bit lines of said at least two columns are connected, a control input, and column outputs which are equal in number to the bit lines connected to the inputs;

gate selection means for selecting one of the gate means by decoding a second address supplied thereto, said gate selection means having inputs for receiving said second address, and a plurality of control outputs respectively connected to each of the control inputs of the gate means;

a plurality of blocks of spare memory cells, each block comprising a plurality of spare memory cells for storing binary data, each of said spare memory cells having an output;

a plurality of spare bit lines respectively connected to each of the outputs of the spare memory cells, said spare bit lines being equal in number to bit lines which are gated by one of the gate means, said spare bit lines being grouped into spare bit line pairs, each of said bit line pairs corresponding to one column and being used for transferring one binary data;

spare gate means for gating the outputs of the spare memory cells, said spare gate means having a control input, and column outputs which are equal in number to columns constituted by the spare bit lines, and inputs connected to the corresponding spare bit lines;

a column selecting means for amplifying one column output signal selected in response to a third address, said column selecting means having inputs connected in parallel to the column outputs of the gate means and spare gate means, and inputs for receiving said third address;

a defective-column decoder having a plurality of storage sections for storing defective-column addresses, inputs for receiving the second and third addresses used for selecting one bit line pair from among the bit line pairs, and an output from which a spare gate selection signal used for selecting the spare gate means is output when the second and third addresses received at the inputs coincide with the defective-column address, the Spare gate selection signal generating, in response to each of the defective-column addresses, one of the column outputs of the gate means which are output in response to the selection of said spare gate selection signal by said column selecting means; and means, having an input supplied with the spare gate selection signal, for prohibiting the control outputs of the gate selection means in response to the spare gate selection signal, wherein the control input of a single spare gate means is used to replace first and second defective memory cells included in first and second blocks which are located in different blocks.

2. A device according to claim 1, wherein each of said storage sections of the defective-column decoder comprises a plurality of fuse and field-effect transistor pairs, said fuses having first ends connected to each other, and second ends respectively connected to drains of the corresponding field-effect transistors, sources of the corresponding field-effect transistors being grounded, and gates thereof receiving bits of the second and third addresses, respectively, said defective column addresses being stored by disconnection of the fuses of said defective-column decoder corresponding to the defective column addresses.

3. A device according to claim 1, wherein bit lines of said defective columns are remedied in units of $m/2^n$ where m is the number of spare bit lines, n is a whole number greater than or equal to zero and $m \geq 2^n$.

* * * * *